US008823177B2

(12) United States Patent
Tsuge et al.

(10) Patent No.: US 8,823,177 B2
(45) Date of Patent: Sep. 2, 2014

(54) SEMICONDUCTOR DEVICE AND PACKAGE WIRING SUBSTRATE WITH MATRIX PATTERN EXTERNAL TERMINALS FOR TRANSMITTING A DIFFERENTIAL SIGNAL

(75) Inventors: Masatoshi Tsuge, Hamura (JP); Makoto Kuwata, Akiruno (JP)

(73) Assignee: Hitachi, Ltd., Tokyo (JP)

( * ) Notice: Subject to any disclaimer, the term of this patent is extended or adjusted under 35 U.S.C. 154(b) by 336 days.

(21) Appl. No.: 13/349,615

(22) Filed: Jan. 13, 2012

(65) Prior Publication Data

US 2012/0187564 A1 Jul. 26, 2012

(30) Foreign Application Priority Data

Jan. 26, 2011 (JP) ................................ 2011-013731

(51) Int. Cl.
*H01L 23/48* (2006.01)
*H01L 23/498* (2006.01)
*H01L 23/50* (2006.01)
(52) U.S. Cl.
CPC .... *H01L 23/49827* (2013.01); *H01L 23/49833* (2013.01); *H01L 23/49822* (2013.01); *H01L 23/50* (2013.01)
USPC ........... 257/773; 257/698; 257/778; 257/786; 257/E23.171; 257/E23.172; 257/E23.173

(58) Field of Classification Search
CPC .............. H01L 23/50; H01L 23/49822; H01L 23/49827; H01L 23/49833
USPC ............ 257/773, 786, E23.01, 690, 698, 778, 257/E23.171, E23.172, E23.173
See application file for complete search history.

(56) References Cited

FOREIGN PATENT DOCUMENTS

JP       2004-158754 A      6/2004
JP        2004158754 A   *  6/2004

\* cited by examiner

*Primary Examiner* — Ermias Woldegeorgis
(74) *Attorney, Agent, or Firm* — Miles & Stockbridge P.C.

(57) ABSTRACT

A semiconductor device or semiconductor device package for transmitting a plurality of differential signals, the reliability of which hardly deteriorates. The semiconductor device is an area array semiconductor device in which a plurality of lands (external terminals) including a plurality of lands for transmitting a plurality of differential signals are arrayed in a matrix pattern in the back surface of a wiring substrate. Some of the lands are located in the outermost periphery of the matrix pattern. Some others of the lands are located inward of the outermost periphery of the matrix pattern and in rows next to the outermost periphery. The spacing between lands in a second region between the lands located in the rows next to the outermost periphery and the side surface of the wiring substrate is larger than in a first region in the outermost periphery.

17 Claims, 15 Drawing Sheets

SEMICONDUCTOR DEVICE AND PACKAGE WIRING SUBSTRATE WITH MATRIX PATTERN EXTERNAL TERMINALS FOR TRANSMITTING A DIFFERENTIAL SIGNAL

CLAIM OF PRIORITY

The present application claims priority from Japanese patent application JP 2011-013731 filed on Jan. 26, 2011, the content of which is hereby incorporated by reference into this application.

FIELD OF THE INVENTION

The present invention relates to a semiconductor device and a semiconductor device package with the same mounted therein and more particularly to technology useful for semiconductor devices such as communication devices which transmit differential signals.

BACKGROUND OF THE INVENTION

Japanese Unexamined Patent Application Publication No. 2004-158754 describes a BGA (ball grid array) semiconductor device in which, between a pair of bump electrodes connected to coupled differential signal lines and a wiring substrate, no other bump electrodes are provided.

SUMMARY OF THE INVENTION

In recent years, in order to improve the performance of computer and communication systems, efforts have been made towards higher speed and multilane interfacing between systems (for example, in the case of a sender side transmission line, plural low speed signals processed in the chip are serialized and sent on higher speed transmission lines through plural lanes arranged in parallel). This kind of high speed interfacing uses SerDes (SERializer/DESerializer) protocols such as Ethernet (registered trademark) and PCI Express to send high speed signals as differential signals.

As semiconductor devices have a higher functionality, there is a tendency that they use a larger number of external terminals. When many external terminals are provided in a semiconductor device, the so-called area array type of semiconductor device is advantageous in avoiding an increase in the area for mounting external terminals because in this type of semiconductor device, the external terminals are arranged in a grid pattern (array or matrix pattern) in the external terminal mounting surface of a wiring substrate (interposer substrate) with a semiconductor chip mounted thereon so the area of the external terminal mounting surface is used effectively.

The present inventors researched into semiconductor devices which transmit plural differential signals and semiconductor device packages in which such a device is mounted and have found the following problem. In a semiconductor device which transmits plural differential signals, the reliability of the semiconductor device or semiconductor device package may deteriorate depending on how the external terminals of the device are arranged.

In the transmission method which uses differential signals, a single differential signal is transmitted based on the potential difference between a pair of transmission lines (differential pair). In order to prevent deterioration in the quality of differential signal transmission, matching between the characteristic impedances of the differential pair is important. This is because if there is a mismatch in the characteristic impedances of the differential pair, the signal waveform quality deteriorates due to increased transmission loss or reflections. In transmitting plural, differential signals, characteristic impedance matching of the plural differential pairs is important. If there should be a characteristic impedance mismatch in the differential pairs, the waveform quality would differ among the differential signals.

However, in an area array semiconductor device, if the external terminals connected to plural differential pairs are arranged arbitrarily, there may occur differences in characteristic impedance among the plural differential pairs or a mismatch in the characteristic impedances of a differential pair. For example, when the board over which a semiconductor device is mounted includes plural wiring layers to provide space for leading out the wires for transmission of differential signals, if first wires to be connected to a first differential pair and second wires to be connected to a second, differential pair are located in different wiring layers of the board, the characteristic impedances would be different between these differential pairs. More specifically, if the wires connected to the differential pairs are provided in wiring layers other than the wiring layer formed in the mounting surface over which the semiconductor device is mounted (uppermost wiring layer), a characteristic impedance mismatch would occur in differential pairs due to the influence of through holes, etc. which electrically interconnect the wiring layers.

A possible approach to preventing characteristic impedance differences among plural differential pairs or a characteristic impedance mismatch in a differential pair as mentioned above is that the external terminals connected to the differential pairs are located only in the outermost periphery of an area array semiconductor device. However, in this case, if the number of differential pairs is increased, the plane area of the external terminal mounting surface of the interposer substrate must be increased in order to provide space for the external terminals. This poses a problem that the semiconductor device mounting area is increased.

The above patent document (Japanese Unexamined Patent Application Publication No. 2004-158754) describes how a pair of bump electrodes (external terminals) connected to the coupled differential signal lines for transmitting a differential signal at a high speed of 40 Gbps or so and other bump electrodes are arranged. However, the document neither discloses nor suggests the above problem that might occur if the invention is applied to a semiconductor device which transmits plural (many) differential signals and any solution to it.

The present invention has been made in view of the above problem and has an object to provide a technique which prevents deterioration in the reliability of a semiconductor device or semiconductor device package which transmits plural differential signals.

The above and further objects and novel features of the invention will more fully appear from the following detailed description in this specification and the accompanying drawings.

A typical aspect of the present invention which will be disclosed herein is briefly outlined below.

According to one aspect of the invention, there is provided an area array semiconductor device in which plural external terminals including plural first external terminal pairs for transmitting plural differential signals are arrayed in a matrix pattern in the back surface of a wiring substrate. Some of the first external terminal pairs are located in the outermost periphery of the matrix pattern. Some others of the first external terminal pairs are located inward of the outermost periphery of the matrix pattern and in rows next to the outermost periphery in the back surface of the wiring substrate. The spacing between external terminals is larger in a second region between the first external terminal pairs located in the rows next to the outermost periphery and the side surface of the wiring substrate than in a first region in the outermost periphery.

The advantageous effect which can be achieved according to the typical aspect of the present invention as disclosed herein is briefly summarized below.

The invention prevents deterioration in the reliability of a semiconductor device or semiconductor device package which transmits plural differential signals.

DETAILED DESCRIPTION OF THE PREFERRED EMBODIMENTS

Description Rules in this Specification

Figure 1:
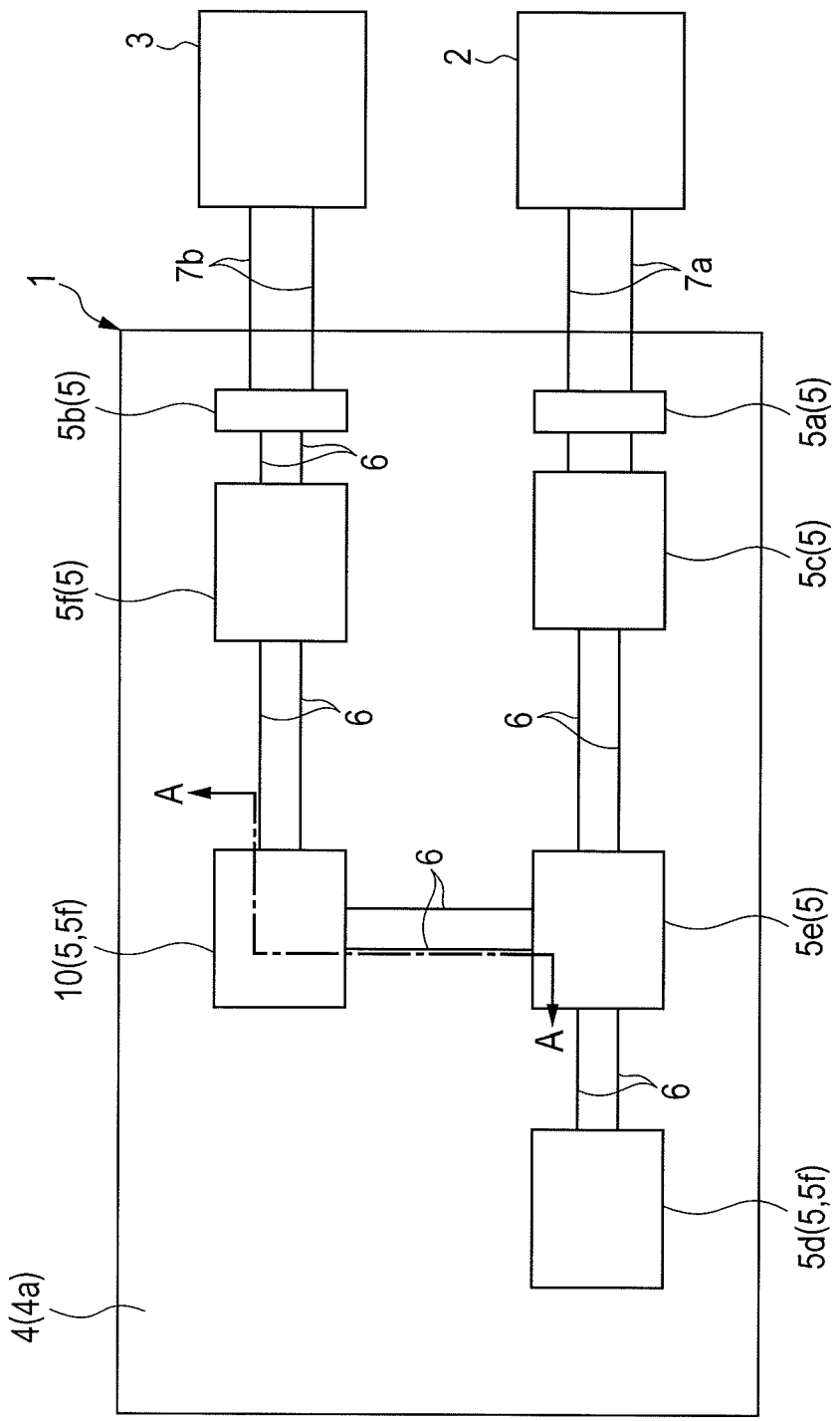
FIG. 1 schematically illustrates the configuration of a semiconductor device package (communication device) including a semiconductor device according to an embodiment of the present invention which transmits differential signals.

Descriptions of the preferred embodiments will be made below separately or in different sections as necessary, but such descriptions are not irrelevant to each other unless otherwise specified. One description may be, in whole or in part, a variation or a detailed or supplementary form of another. Also, in the preferred embodiments described below, even when a specific number is indicated for an element (the number of pieces, numerical value, quantity, range, etc.), it is not limited to the specific number unless otherwise specified or theoretically limited to the number; it may be larger or smaller than the specific number.

In the preferred embodiments described below, constituent elements (including constituent steps) are not necessarily essential unless otherwise specified or theoretically essential. Similarly, in the preferred embodiments described below, when a specific form or positional relation is indicated for a constituent element, it should be interpreted to include a form or positional relation which is virtually equivalent or similar to the specific form or positional relation unless otherwise specified or unless it should be theoretically limited to the specific form or positional relation. The same can be said of a numerical value and range of the above.

Next, preferred embodiments will be described in detail referring to the accompanying drawings. In all the drawings that illustrate the preferred embodiments, like elements are designated by like reference numerals and repeated descriptions thereof are omitted.

General Structure of the Semiconductor Device Package and Semiconductor Device

Figure 2:
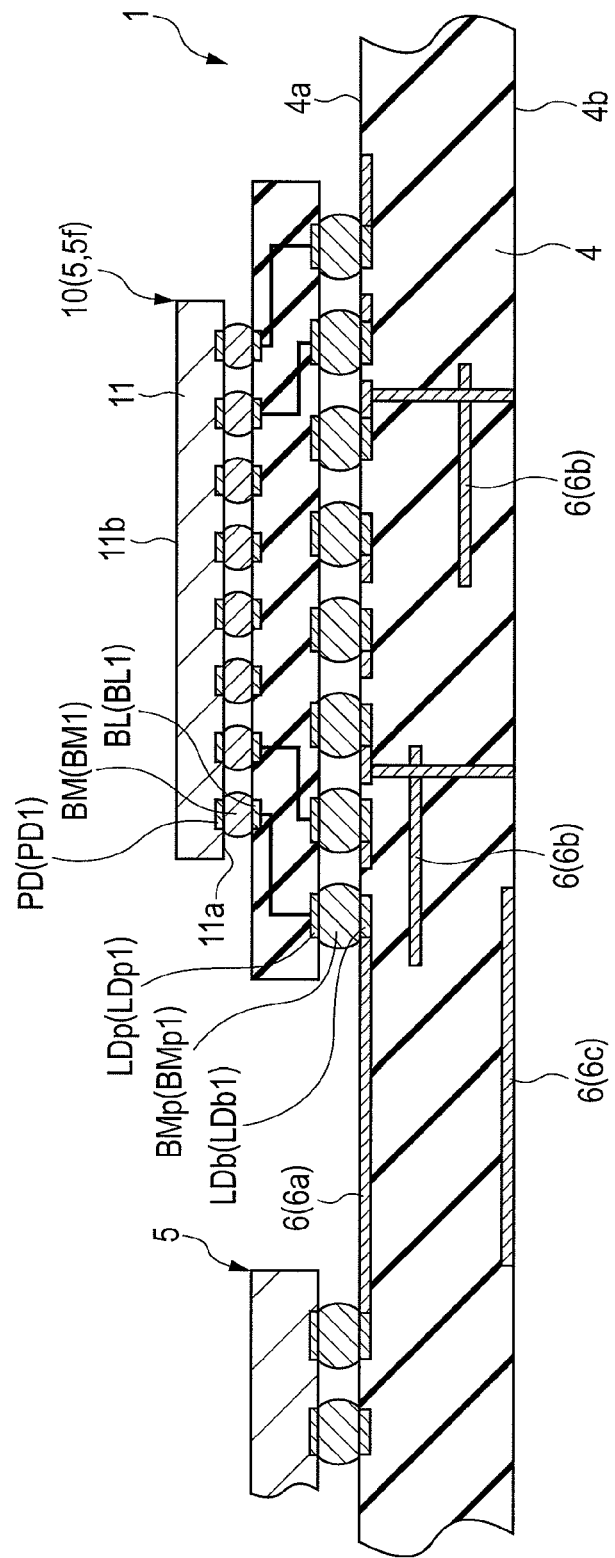
FIG. 2 is an enlarged sectional view taken along the line A-A in FIG. 1.

Next, a semiconductor device package in which a semiconductor device is mounted to transmit differential signals will be described as an embodiment of the invention which is applied to a communication device. FIG. 1 schematically illustrates the configuration of the semiconductor device package (communication device) including the semiconductor device according to this embodiment which transmits differential signals. FIG. 2 is an enlarged sectional view taken along the line A-A in FIG. 1.

The communication device 1 (semiconductor device package) according to this embodiment as shown in FIG. 1 is a communication device which transmits signals between plural external devices 2 and 3. In the example shown in FIG. 1, it sends an Ethernet protocol signal to the external device 2 or receives an Ethernet protocol signal from the external device 2 and sends a PCI Express protocol signal to the external device 3 or receives a PCI Express protocol signal from the external device 3. In other words, the communication device 1 is an interface device which mutually converts different protocol signals to exchange signals with the external devices 2 and 3.

The communication device 1 includes plural electronic components 5 including a semiconductor device (semiconductor package) 10 which transmits differential signals, and a mounting board (wiring substrate, motherboard, or printed circuit board) 4. The mounting board 4 has a front surface (upper surface) 4a over which the electronic components 5 including the semiconductor device 10 are mounted, and a back surface (lower surface) 4b (see FIG. 2) which is opposite to the front surface 4a. These electronic components 5 are mounted over the front surface 4a of the mounting board 4 and interconnected through plural wires 6 formed in the mounting board 4.

Although the configuration of the communication device 1 is not limited to the one shown in FIG. 1, the electronic components 5 shown in FIG. 1, for example, include a connector (connecting device) 5a which makes a connection with the external device 2 through wires 7a. The wires 7a are used to transmit Ethernet (registered trademark) signals. The electronic components 5 also include a connector (connecting device) 5b which makes a connection with the external device 3 through wires 7b. The wires 6 and 7b are used to transmit PCI Express signals. The electronic components 5 also include a signal switching device (semiconductor device, switch) 5c which switches the signal data format (protocol) of input and output signals. The electronic components 5 also include an arithmetic processing unit (semiconductor device) 5*d* which processes an incoming signal and outputs the processed signal. Also, the electronic components 5 include a repeating device (semiconductor device) 5*e* which relays signals. The electronic components 5 also include signal processing units (semiconductor devices) 5*f* which process an incoming signal and transmit the processed signal as an output. These electronic components 5 are electrically connected through the wires 6 and differential signals are transmitted between the electronic components 5, for example, at a speed ranging from 5 Gbps (Gigabits per second) to 14 Gbps. Among the signal processing units 5*f* shown in FIG. 1, for example, the semiconductor device 10 is an amplifier which amplifies an incoming signal and outputs the amplified signal. Hereinafter, the semiconductor device 10 shown in FIG. 1 is described as a typical example of a semiconductor device which transmits differential signals, but the repeating device 5*e* and the other signal processing units 5*f* are also semiconductor devices which transmit differential signals and the technique described below can also be applied to them. Although only the seven electronic components 5 are shown in FIG. 1 for simple illustration, the number of electronic components 5 is not limited thereto. For example, a power supply circuit device can also be mounted to feed the supply voltage or reference voltage to the electronic components 5. Also, the number of signal processing units 5*f* may be increased.

Figure 3:
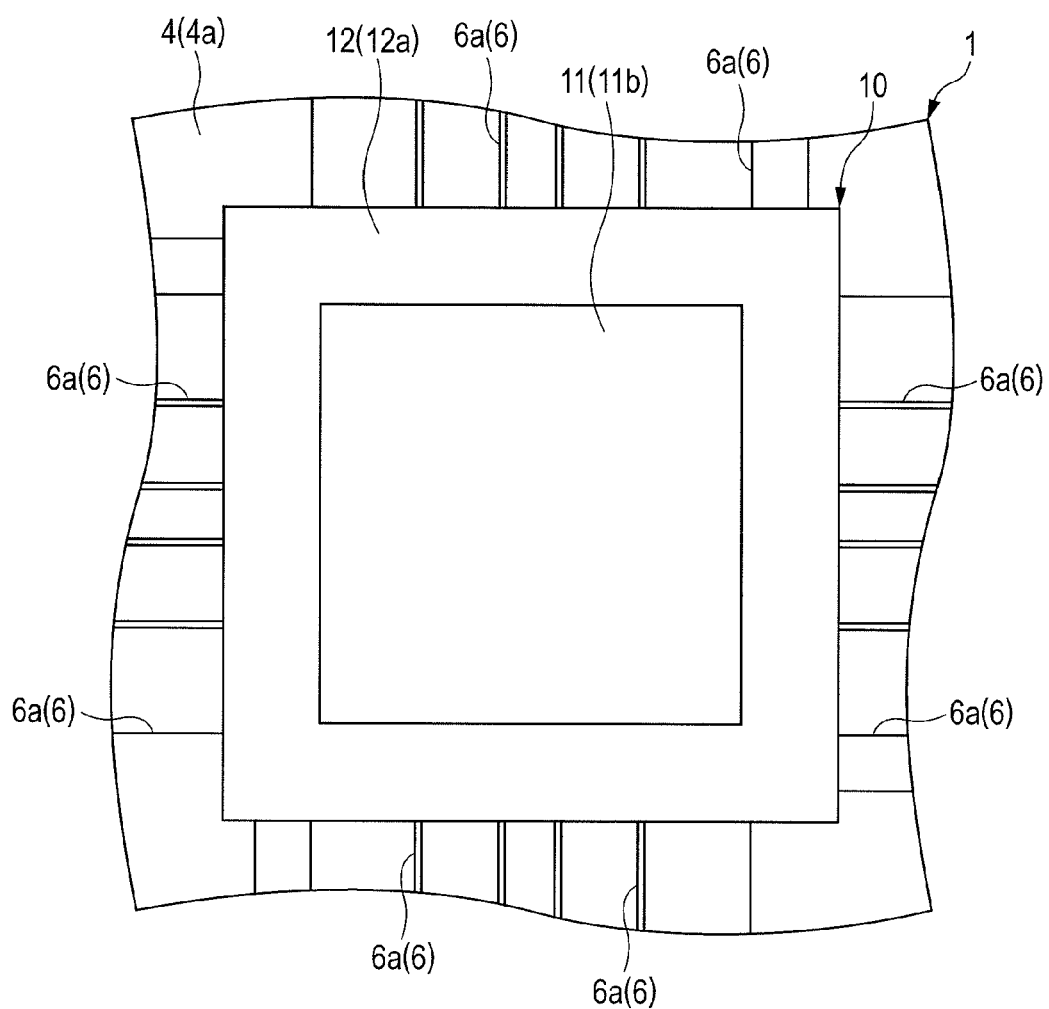
FIG. 3 is an enlarged plan view showing the front surface of the semiconductor device shown in FIG. 1 which transmits differential signals and its vicinity.
Figure 4:
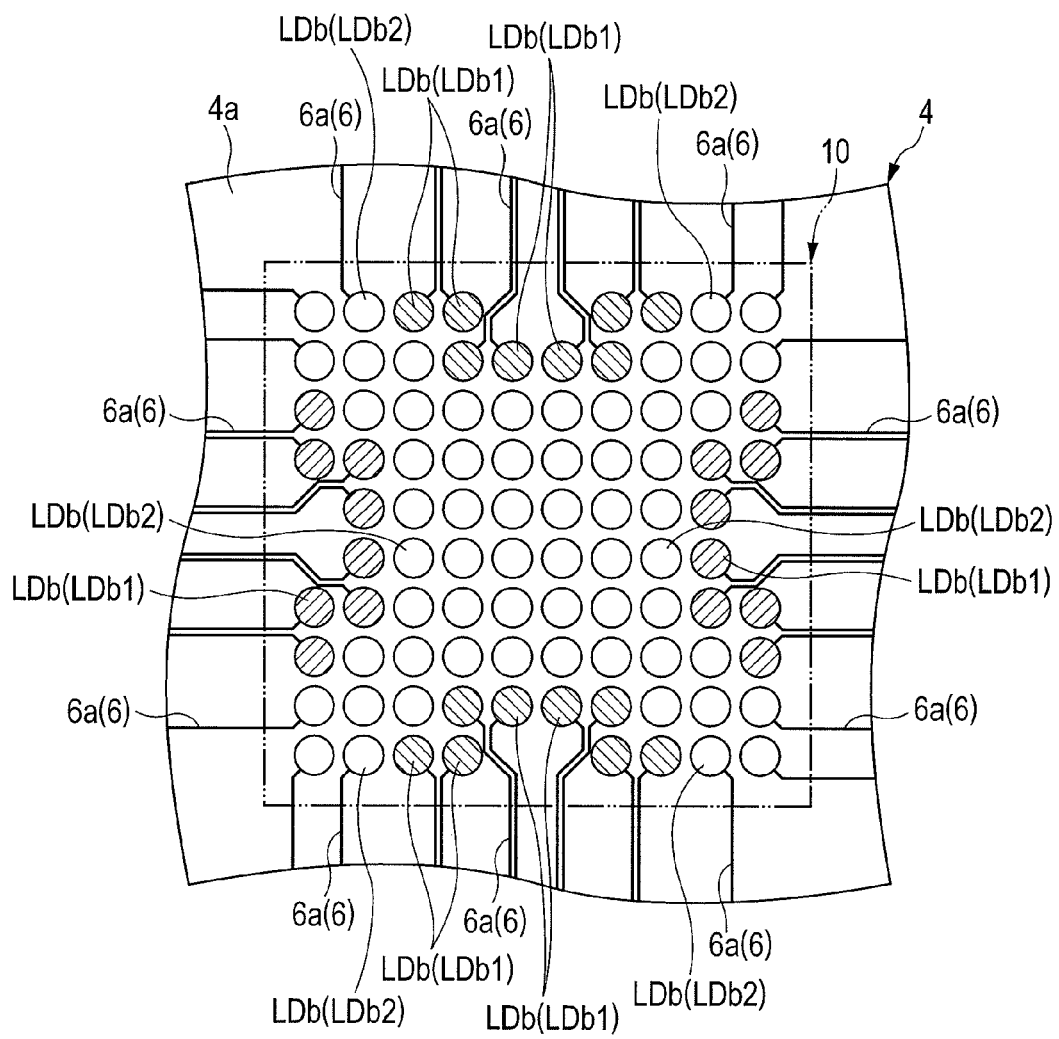
FIG. 4 is an enlarged plan view of what is shown in FIG. 3 in which the semiconductor device is removed.
Figure 5:
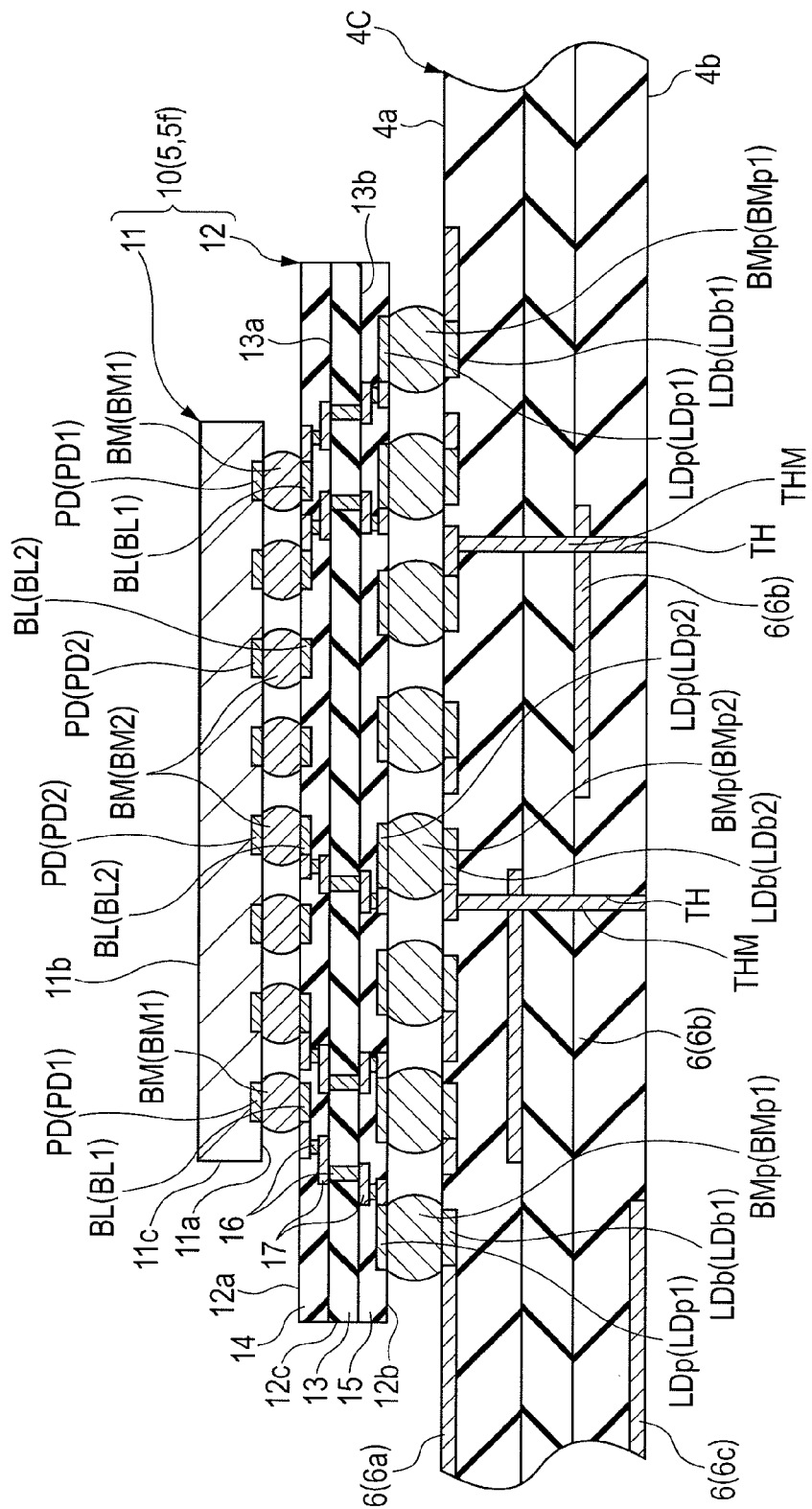
FIG. 5 is an enlarged sectional view showing the semiconductor device shown in FIG. 3 and the mounting board.
Figure 6:
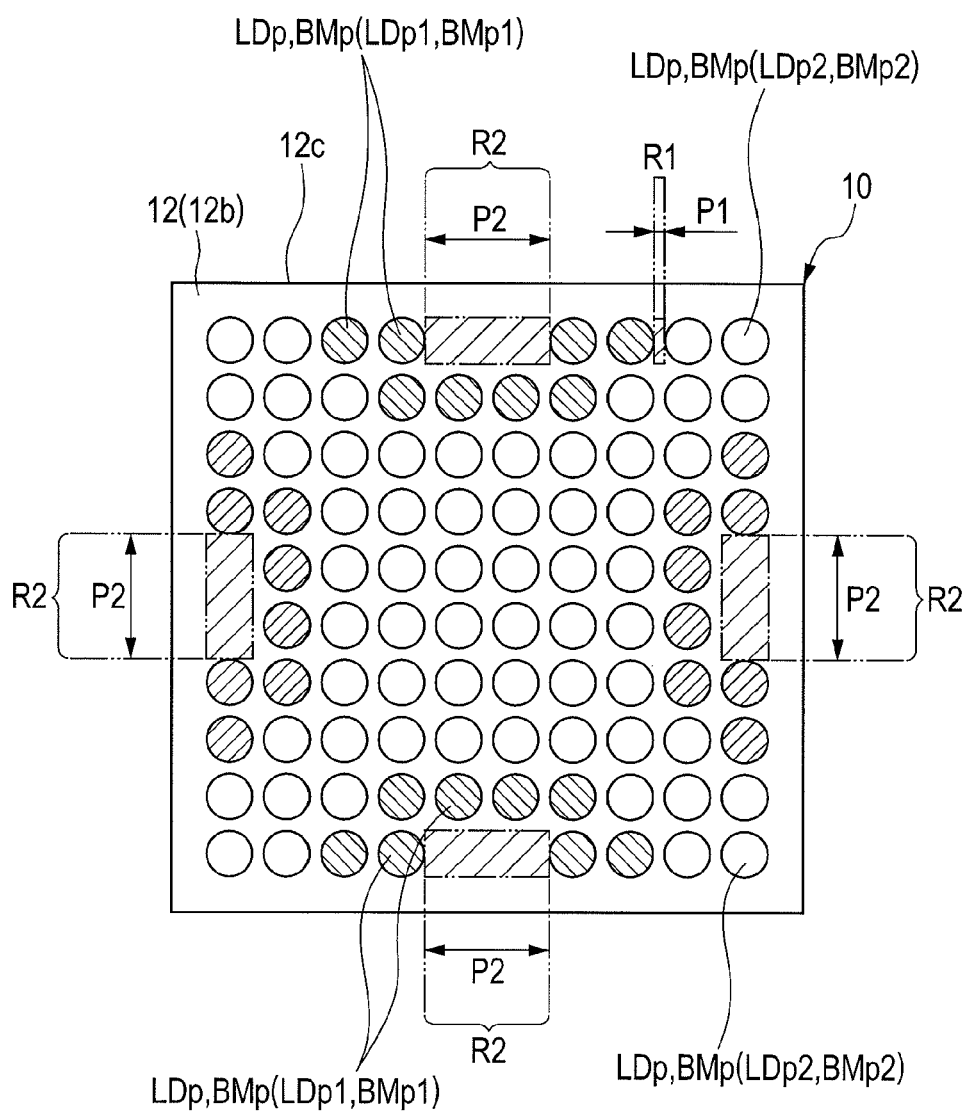
FIG. 6 is a plan view showing the back surface of the semiconductor device shown in FIG. 3

Detailed Structure of the Semiconductor Device and Semiconductor Device Mounting Board Next, the semiconductor device 10 and mounting board 4 shown in FIG. 1 will be described in detail. FIG. 3 is an enlarged plan view showing the front surface of the semiconductor device shown in FIG. 1 which transmits differential signals and its vicinity. FIG. 4 is an enlarged plan view showing what is shown in FIG. 3 in which the semiconductor device is removed; FIG. 5 is an enlarged sectional view showing the semiconductor device shown in FIG. 3 and the mounting board; and FIG. 6 is a plan view showing the back surface of the semiconductor device shown in FIG. 3.

As shown in FIGS. 3 to 5, the semiconductor device 10 is a package (semiconductor package) having a chip (semiconductor chip) 11 and a wiring substrate (interposer substrate, package substrate) 12 over which the chip 11 is mounted. As shown in FIG. 5, the chip 11 has a main surface (front surface, first main surface) 11*a* in which plural pads (electrodes) are formed, a back surface (second main surface) 11*b* opposite to the main surface 11*a*, and a side surface 11*c* which crosses the main surface 11*a* and back surface 11*b*, in which the main surface 11*a* and back surface 11*b* each have a quadrangular (tetragon) planar shape. For example, in this embodiment, the main surface 11*a* and back surface 11*b* are each a square about 3 mm on a side. A bump (electrode, convex electrode) BM as a conductive member which electrically connects the wiring substrate 12 and the chip 11 is joined to each of plural pads PD and the pads PD are electrically connected to plural leads (bonding leads) BL of the wiring substrate 12 through the bumps BM. This embodiment gives an example of the face-down mounting method (also called flip-chip mounting) in which the chip 11 is mounted over the wiring substrate 12 with the main surface 11*a* of the chip 11 facing the front surface 12*a* (chip mounting surface, upper surface) of the wiring substrate 12. Therefore, bumps BM, for example, of gold or solder are used as conductive members which electrically connect the chip 11 and wiring substrate 12. Though not shown, the face-up mounting method may be adopted as a variation in which the chip 11 is mounted over the wiring substrate 12 with the back surface 11*b* of the chip 11 facing the front surface 12*a* of the wiring substrate 12. In this case, plural wires (not shown) may be used as conductive members which electrically connect the chip 11 and wiring substrate 12. In this case, in order to protect the wires, the wires and chip 11 are resin-sealed. However, the face-down mounting method is more desirable in the sense that the distance between the chip 11 and wiring substrate 12 should be shortened, so this embodiment adopts the face-down mounting method as shown in FIG. 5 which will be described next.

The pads PD include plural pads (first electrodes) PD1 which constitute first electrode pairs for transmitting a differential signal, and plural pads (second electrodes) PD2 in which a different current from the current flowing in the pads PD1 flows. The bumps BM include plural bumps (first electrodes) BM1 which constitute the first electrode pairs for transmitting a differential signal, and plural bumps (second electrodes) BM2 in which a different current from the current flowing in the bumps BM1 flows. The pads PD2 and bumps BM2 are, for example, electrodes which feed the supply voltage or reference voltage to the chip 11 or electrodes for transmitting a signal different from a differential signal. On the other hand, in the transmission method which uses differential signals, a single differential signal is sent based on the potential difference between a pair of transmission lines (differential pair), so plural (two) pads PD1 and plural (two) bumps BM1 constitute a differential pair. The semiconductor device 10 has plural differential pairs. In the example shown in FIG. 4, it has 16 differential pairs (indicated by hatching). This means that the chip 11 has plural pairs of pads PD1 which are connected to plural bumps BM1. Specifically, it has 92 pads PD and bumps BM, of which 32 pads PD1 and bumps BM1 constitute 16 differential pairs and the other pads and bumps are pads PD2 and bumps BM2. The pads PD1 and bumps BM1 which constitute differential pairs are adjacent to each other. This makes it easier to equalize the length of the transmission lines which constitute differential pairs.

The wiring substrate 12 shown in FIG. 5 has a front surface (chip mounting surface, upper surface) 12*a* over which the chip 11 is mounted, a back surface 12*b* opposite to the front surface 12*a*, and a side surface 12*c* which crosses the front surface 12*a* and back surface 12*b*, in which the front surface 12*a* and back surface 12*b* each have a quadrangular (tetragon) planar shape. For example, in this embodiment, the front surface 12*a* and back surface 12*b* are each a square about 5-10 mm on a side which is longer than the length of each side of the chip 11. The wiring substrate 12 is a multilayer wiring substrate having plural wiring layers (four layers in the example of FIG. 5). It is formed by a so-called build-up technique as follows: an opening is made in the insulating layer of each wiring layer and a conductor membrane is buried in the opening to form an interlayer conducting path and plural such wiring layers are stacked. More specifically, an internal wiring layer is formed in each of the upper surface 13*a* and lower surface 13*b* of a core layer 13 and the internal wiring layers are covered by insulating layers 14 and 15 respectively. A front surface wiring layer is formed in the upper surface (which corresponds to the front surface 12*a* of the wiring substrate 12) of the insulating layer 14 and a back surface wiring layer is formed in the lower surface (which corresponds to the back surface 12*b* of the wiring substrate 12) of the insulating layer 15. The wiring layers are electrically interconnected through plural vias 16 as interlayer conducting paths. The wires 17 and vias 16 in the wiring layers are formed, for example, by depositing metal film such as copper or nickel film using a plating technique and pattering it. The vias 16 thus made by the build-up technique are desirable in the sense that the impedance component is less likely to increase than in the case of interlayer conducting paths formed by making through holes penetrating plural wiring layers and burying conductor in the through holes. The front surface wiring layer and back surface wiring layer of the wiring substrate 12 are each covered by an insulating film such as solder resist film, though not shown in FIG. 5.

Plural leads (bonding leads) BL are formed in the front surface 12a of the wiring substrate 12 as the chip mounting surface. The leads BL are formed in the same layer as the front surface wiring layer and are integral with the wires 17 constituting the front surface wiring layer. The number of leads BL is equal to the number of pads PD as the electrodes of the chip 11 to which they are connected and the leads are located opposite to the corresponding pads PD. The leads BL include leads BL1 to be connected with bumps BM1 and leads BL2 to be connected with bumps BM2. The leads BL1 are constituents of a differential pair for transmitting a differential signal. Although the front surface wiring layer of the wiring substrate 12 is covered by an insulating film as mentioned above, openings are made in places where the leads BL are located and the leads BL are exposed in the openings from the insulating film.

Plural lands (package bump lands, external terminals) LDp are formed in the back surface 12b of the wiring substrate 12 which faces the mounting board. The lands LDp are formed in the same layer as the back surface wiring layer and are integral with the wires 17 constituting the back surface wiring layer. These lands LDp are electrically connected with the leads BL in the front surface 12a through the wires 17 and vias 16 made in the wiring layers of the wiring substrate 12. In other words, the lands LDp as external terminals of the semiconductor device 10 are electrically connected with the pads PD of the chip 11. Also, the lands LDp are joined to bumps (solder balls, external terminals, joining members) BMp as joining members for connecting the lands LDp with the lands (mounting board bump lands, mounting terminals) LDb of the mounting board 4. The bumps BMps are made of, for example, solder and function as joining members for electrical connection between the lands LDp and lands LDb, though they may also be defined as external terminals of the semiconductor device 10.

The mounting board 4 shown in FIG. 5 has a front surface 4a as a mounting surface over which the semiconductor device 10 is mounted. The mounting board 4 has plural wiring layers (four layers in the example of FIG. 5) each having plural wires (mounting board wires) 6. The lands LDp to be electrically connected with the lands LDp of the semiconductor device 10 lie in the uppermost wiring layer over which the semiconductor device 10 is mounted, among the wiring layers of the mounting board 4. The lands LDb are located opposite to the lands LDp of the semiconductor device 10 and they are electrically connected through the bumps BMp. The lands LDb are also electrically connected with the wires 6 of the mounting board 4. In other words, the wiring substrate 4 is similar to the wiring substrate 12 in that it is a multilayer wiring substrate having plural wiring layers. However, the mounting board 4 is different from the wiring substrate 12 in that the interlayer conducting paths for electrical connection between wiring layers are as follows. The interlayer conducting paths of the mounting board 4 are each a conductor membrane (in-hole conductor) THM formed in a through hole TH which penetrates plural wiring layers. For example, the mounting board 4 is produced as follows. Insulating layers bearing a previously formed conductor pattern including plural wires 6 are stacked and through holes TH are made to penetrate all the insulating layers (wiring layers); then, for example, using a plating technique, conductor membranes are formed in the through holes TH, for electrical connection between wiring layers. The manufacturing process for the mounting board 4 which is thus produced is simpler than that for the wiring substrate 12 which is produced by the build-up technique, which leads to cost reduction.

Figure 10:
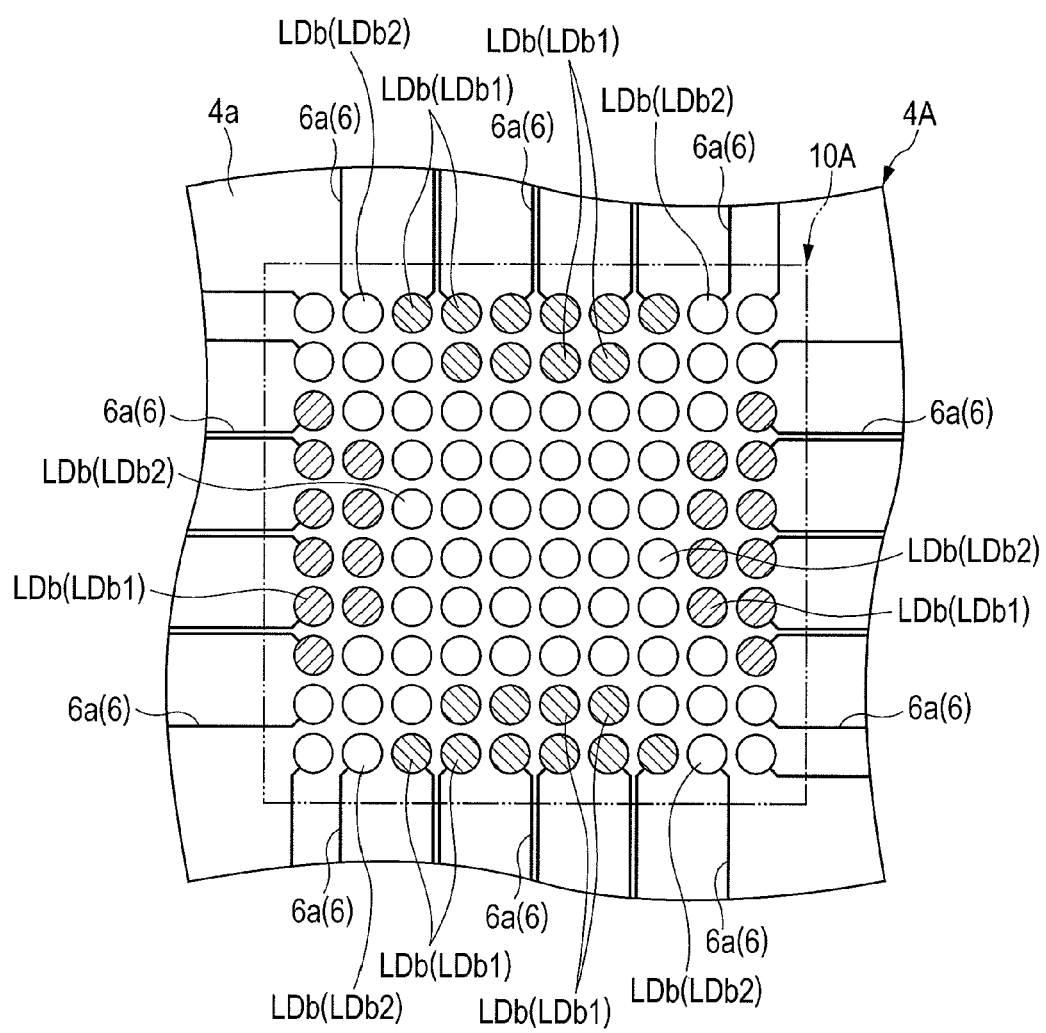
FIG. 10 is an enlarged plan view showing the front surface of a mounting board in a first comparative example for comparison with what is shown in FIG. 4.
Figure 11:
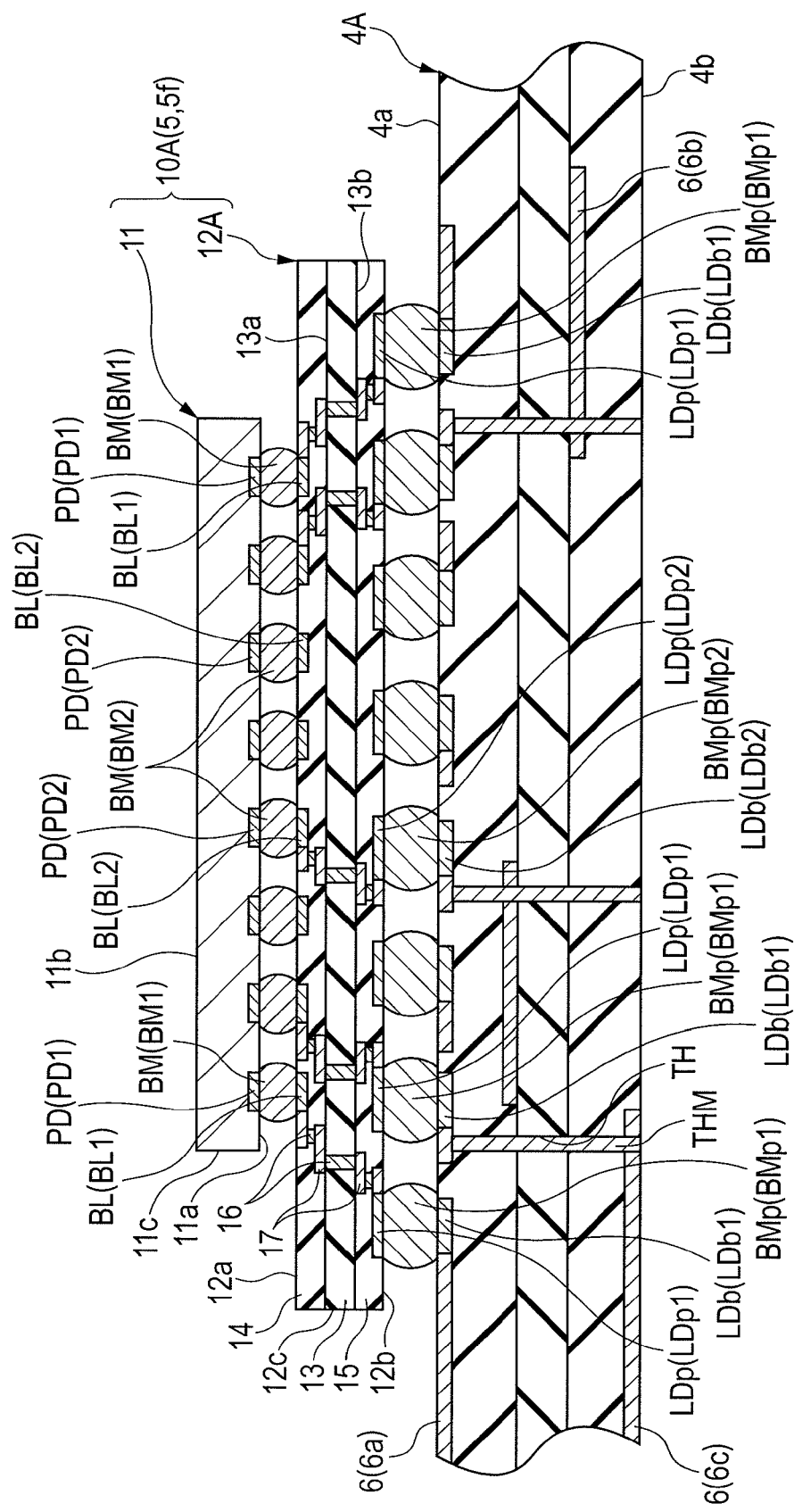
FIG. 11 is an enlarged sectional view showing the semiconductor device and mounting board in the first comparative example for comparison with what is shown in FIG. 5.
Figure 12:
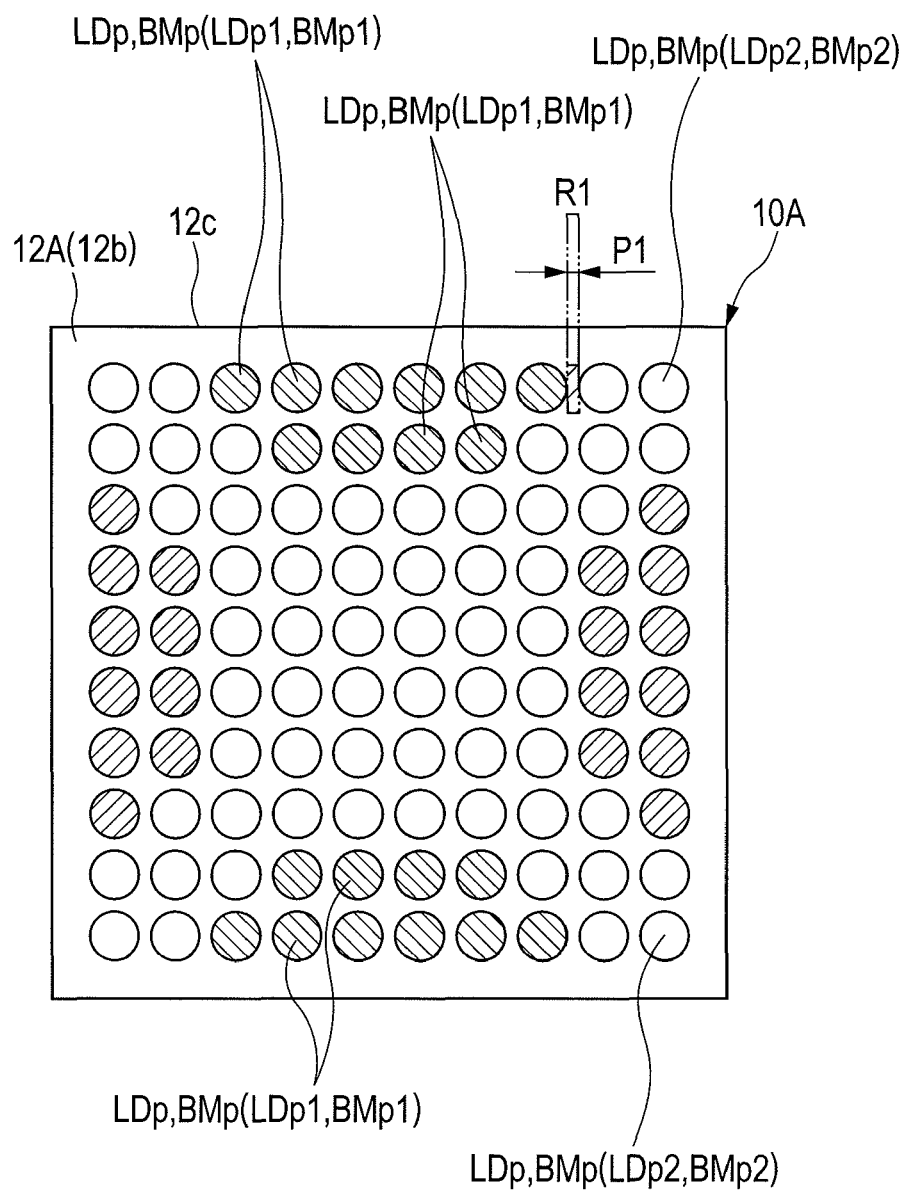
FIG. 12 is a plan view showing the semiconductor device in the first comparative example for comparison with what is shown in FIG. 6.
Figure 13:
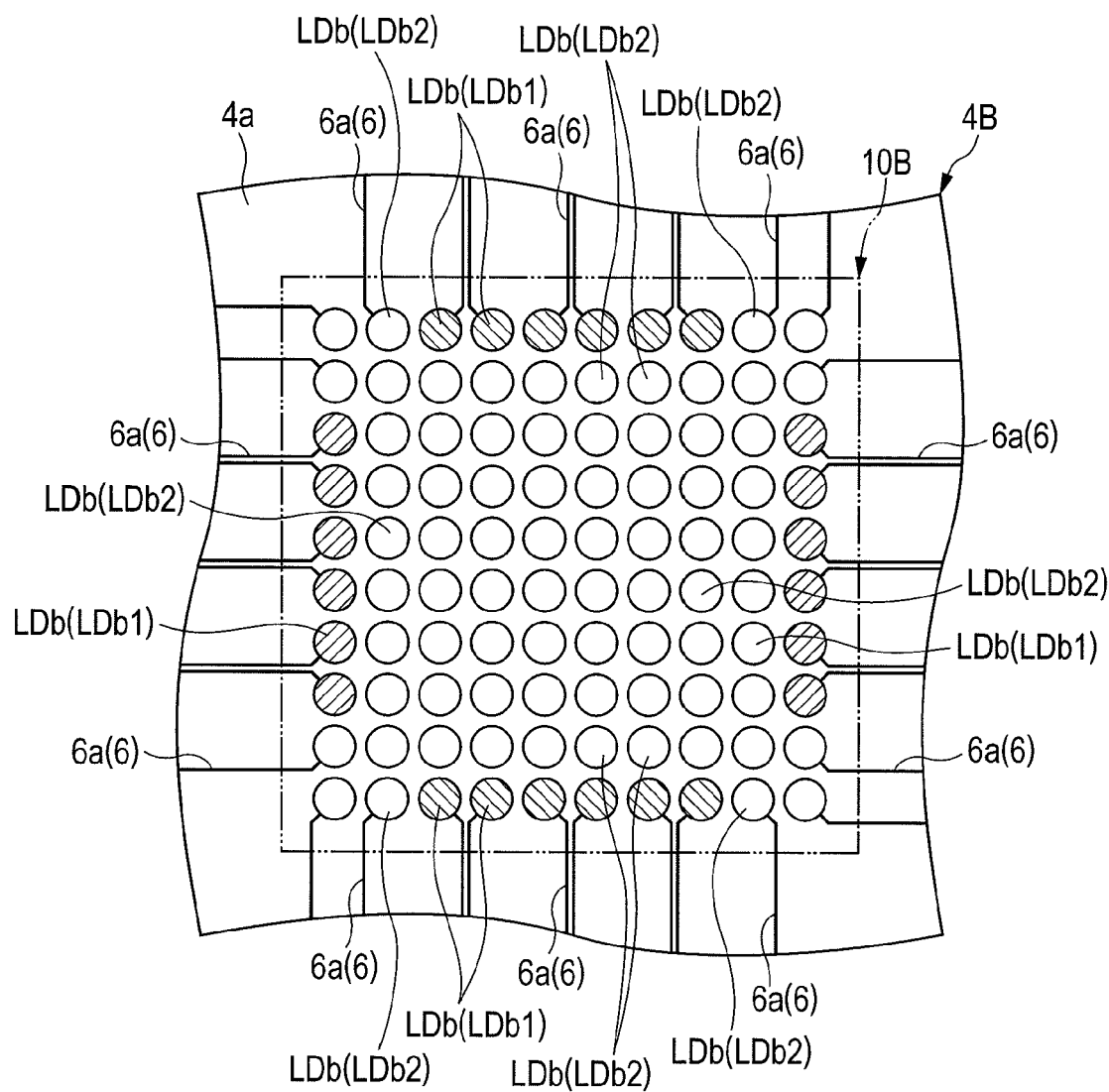
FIG. 13 is an enlarged plan view showing the front surface of a mounting board in a second comparative example for comparison with what is shown in FIG. 4.
Figure 14:
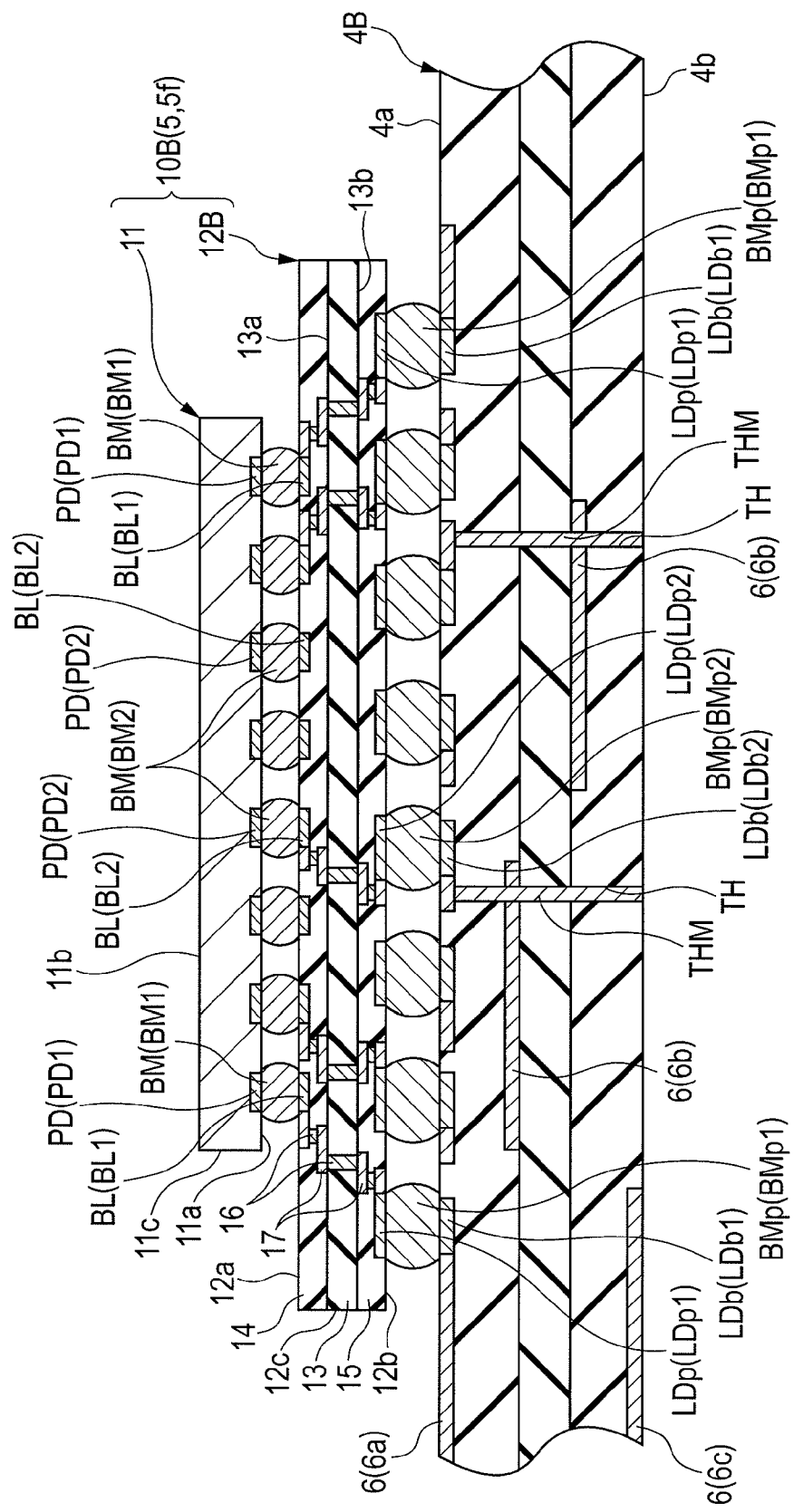
FIG. 14 is an enlarged sectional view showing the semiconductor device and mounting board in the second comparative example for comparison with what is shown in FIG. 5.
Figure 15:
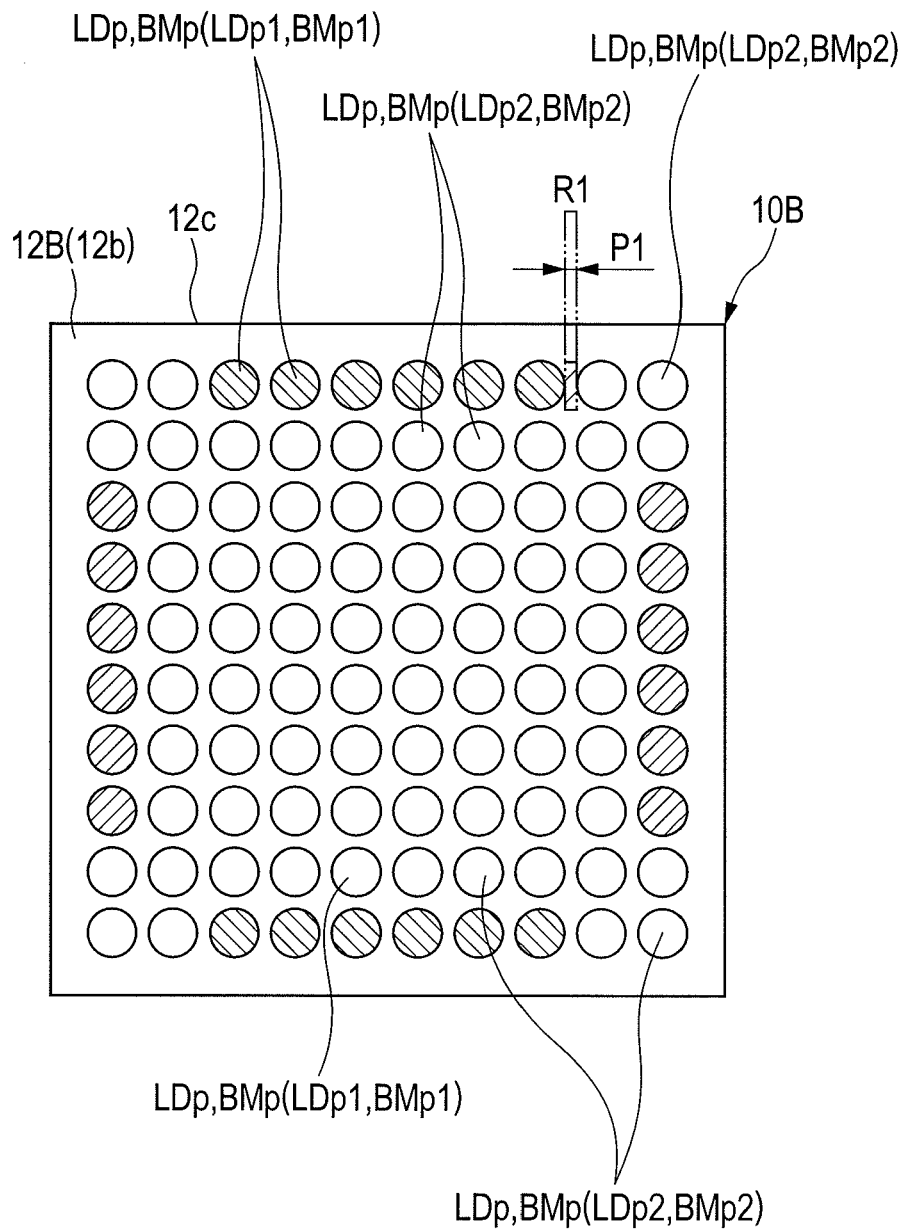
FIG. 15 is a plan view showing the semiconductor device in the second comparative example for comparison with what is shown in FIG. 6.

Arrangement of the External Terminals of the Semiconductor Device and the Mounting Terminals of the Mounting Substrate Next, how the lands LDp of the semiconductor device 10 and the lands LDb of the mounting board 4 are arranged will be described. FIGS. 10, 11, and 12 show a semiconductor device and mounting board in a first comparative example for comparison with what is shown in FIGS. 4, 5, and 6 respectively. FIGS. 13, 14, and 15 show a semiconductor device and mounting board in a second comparative example for comparison with what is shown in FIGS. 4, 5, and 6 respectively.

As shown in FIGS. 6, 12, and 15, the semiconductor devices 10, 10A, and 10B are area array semiconductor devices having plural lands LDp as external terminals which are arrayed in a matrix pattern (grid pattern) in the back surfaces 12b of the wiring substrates 12, 12A, and 12B respectively. Also, as shown in FIGS. 5, 11, and 14, they are so-called BGA (ball grid array) semiconductor devices in which a bump BMp is joined to each of the lands LDp. Although the semiconductor devices 10, 10A, and 10B have many external terminals (92 external terminals in FIGS. 6 and 100 external terminals in FIGS. 12 and 15), the mounting area is kept relatively small by the area array arrangement of the external terminals.

While the mounting area can be kept relatively small in the area array semiconductor devices 10, 10A, and 10B as mentioned above, the mounting boards 4, 4A, and 4B have plural wiring layers in order to provide space to lead the wires out. Specifically, as shown in FIGS. 5, 11, and 14, some of the lands LDb are connected to an external device without being passed through the underlying wiring layers (namely directly by the wires 6a in the upper most layer). On the other hand, some other lands LDb are led to the wires 6b and 6c in the underlying wiring layers through the conductor membranes THM in the through holes TH and connected to the external device.

In the area array semiconductor device 10, when some conducting paths are led to the wires 6b and 6c in the underlying wiring layers, if the external terminals to be connected to plural differential pairs are arranged arbitrarily, there may occur differences in characteristic impedance among the differential pairs or characteristic impedance mismatching in a differential pair. For example, in the semiconductor device 10A and mounting board 4A as shown in FIGS. 10 to 12, it is impossible to provide space to lead out the wires 6 to be connected to the lands LDb located inward of the outermost periphery, so some of the lands LDb1 for differential pairs are led to the wires 6b and 6c in the underlying wiring layers and electrically connected to the external device. In other words, the lands LDb1 for differential pairs are electrically connected to the external device through different wiring layers in the mounting board 4A.

In the transmission method which uses differential signals, a differential signal is sent based on the potential difference between a pair of transmission lines (differential pair). If a characteristic impedance mismatch in the differential pair occurs, the signal waveform quality may deteriorate due to increased transmission loss or reflections, so characteristic impedance matching in the differential pair is important. Deterioration in the signal waveform quality which is caused by a characteristic impedance mismatch in the differential pair may pose a problem particularly when the signal transmission speed is high; for example, the problem emerges when the transmission speed exceeds 5 Gbps. From the viewpoint of characteristic impedance matching in a differential pair, it is desirable to equalize the path length of the conducting paths constituting the differential pair. If conducting paths constituting a differential pair are connected to the conductor membrane THM in a through hole TH penetrating all the wiring layers as in the mounting board 4A shown in FIG. 11, they may be affected by increased transmission loss or reflections due to the conductor membrane THM. Therefore, it is desirable that the conducting paths constituting a differential pair should be not connected to a conductor membrane THM. Namely, it is desirable that as in the mounting board 4 shown in FIG. 5, among the lands LDb formed in the front surface 4a of the mounting board 4, the lands LDb1 for transmitting a differential signal should be electrically connected to an electronic component 5 (see FIG. 2) as an external device through the wires 6a in the uppermost layer without being connected to the conductor membranes THM.

Furthermore, if the characteristic impedances of plural differential pairs differ, the differential signals differ in signal waveform quality, so in transmitting plural differential signals it is important to equalize the characteristic impedance among the differential pairs. Therefore, it is desirable that the wires 6 constituting plural differential pairs should, lie in the same layer as shown in FIG. 5. Also from the viewpoint of characteristic impedance matching in each of the differential pairs, it is particularly desirable that among the plural lands LDb formed in the front surface 4a of the mounting board 4, the lands LDb1 for plural differential pairs for transmitting a differential signal should be electrically connected to an electronic component 5 (see FIG. 2) as an external device through the wires 6a in the uppermost layer without being connected to the conductor membranes THM.

Another possible approach to connecting all the lands LDb1 constituting differential pairs to the external device through the wires 6a in the uppermost layer is that all the lands LDb1 (as well as the bumps BMp1 and lands LDp1 joined to the lands LDb1) are located only in the outermost periphery (outermost rows) of the matrix pattern as exemplified by the semiconductor device 10B and mounting board 4B shown in FIGS. 13 to 15. When the lands LDb1 are located in the outermost periphery, space to lead out the wires 6a in the uppermost layer can be easily obtained, so all the lands LDb1 can be led out through the wires 6a in the uppermost layer. However, the number of external terminals which can be located in the outermost periphery is limited, which means that in the second comparative example shown in FIGS. 13 to 15, the number of differential pairs is limited. In the second comparative example shown in FIGS. 13 to 15, the number of differential pairs is smaller by 4 than in this embodiment shown in FIGS. 4 to 6. In other words, in order to increase the number of differential pairs, the plane area of the wiring substrate 12B must be increased, which will reduce the advantage as an area array semiconductor device that can keep the mounting area relatively small.

In order to solve the above problem, the present inventors arrange the external terminals of the semiconductor device 10 as shown in FIG. 6. Specifically, in the semiconductor device 10, among the lands LDp (bumps BMp) as external terminals, some of the lands LDp1 (bumps BMp1) for differential pairs are located in the outermost periphery of the matrix pattern. Also, among the lands LDp (bumps BMp) as external terminals, some others of the lands LDp1 (bumps BMp1) for differential pairs are located inward of the outermost periphery of the matrix pattern and in rows next to the outermost periphery in the back surface 12b of the wiring substrate 12. The outermost periphery of the matrix pattern includes first regions R1 in which lands LDp (bumps BMp) are arranged at a first spacing P1, and second regions R2 in which lands LDp (bumps BMp) are arranged at a second spacing P2 larger than the first spacing P1. The second regions R2 lie between the lands LDp1 (bumps BMp1) located inward of the outermost periphery and the side surfaces 12c of the wiring substrate 12. From another viewpoint, in this embodiment, there are regions (second regions R2) where no bumps BMp exist between the lands LDp1 (bumps BMp1) located inward of the outermost periphery, among the lands LDp (bumps Bmp) arrayed in a matrix pattern, and the side surfaces 12c of the wiring substrate 12.

Since the lands LDb formed in the front surface 4a as shown in FIG. 4 are located opposite to the lands LDp1 of the semiconductor device 10 as shown in FIG. 5, the arrangement of the lands LDb of the mounting board 4 is the same as the arrangement of the lands LDp of the semiconductor device 10. Specifically, as shown in FIG. 4, among the lands LDb as mounting terminals, some of the lands LDb1 for differential pairs are located in the outermost periphery of the matrix pattern. Also, among the lands LDb as mounting terminals, some others of the lands LDb1 for differential pairs are located inward of the outermost periphery of the matrix pattern and in rows next to the outermost periphery in the front surface 4a of the mounting board 4. The outermost periphery of the matrix pattern here includes first regions in which lands LDp (regions facing the first regions R1 shown in FIG. 6) are arranged at a first spacing, and second regions (regions facing the second regions R2 shown in FIG. 6) in which lands LDp (bumps BMp) are arranged at a second spacing larger than the first spacing. Also, wires 6a for differential pairs to be electrically connected to the lands LDb1 located inward of the outermost periphery are provided in the second regions of the mounting board 4. In other words, the wires 6a for differential pairs to be electrically connected to the lands LDb1 located inward of the outermost periphery are drawn out via the second regions in which the spacing is larger than in the first regions.

This arrangement makes it possible to provide paths to draw out the wires to be connected to the lands LDb1 for differential pairs which are located inward of the outermost periphery in the front surface 4a of the mounting board 4 as shown in FIG. 4. In other words, in the front surface 4a of the mounting board 4 shown in FIG. 4, no lands LDb are located in the regions facing the second regions R2 shown in FIG. 6 and these regions can be used as space to draw out the wires 6a. For their use as space to draw out the wires 6a, it is desirable that the spacing P2 of the second regions R2 should be as large as possible. In the example shown in FIG. 6, the spacing P2 of the second regions R2 is larger than an equivalent to two lands LDp located in the outermost periphery. Consequently as shown in FIG. 4, enough space for a total of four wires 6a for two differential pairs can be obtained in the regions of the mounting board 4 facing the second regions R2 (see FIG. 6). However, the spacing P2 of the second regions. R2 is not limited to the abovementioned; for example, if wires 6a for one differential pair are to be provided in a region facing a second region R2, the spacing P2 of the second region R2 has only to be larger than an equivalent to one land Dp1 located in the outermost periphery. If wires 6a for three or more differential pairs are to be provided in a region facing a second region R2, desirably the spacing P2 of the second region R2 should be larger than an equivalent to three lands LDp located in the outermost periphery.

Thus, since the spacing P2 of the second regions R2 is larger than the spacing P1 of the first regions R1 as shown in FIG. 6, the lands LDb1 for differential pairs are led out by the wires 6 formed in the same wiring layer and connected to an electronic component 5 (see FIG. 2) as an external device. Therefore, the conducting paths for differential pairs can be easily equalized in length. Also, the characteristic impedances of the plural differential pairs can be made uniform. Particularly in this embodiment, as shown in FIG. 4, the lands LDb1 for differential pairs are led out by the wires 6a formed in the uppermost wiring layer and connected to an electronic component 5 (see FIG. 2) as an external device. Therefore the influence of increased transmission loss or reflections due to the conductor membranes THM in the through holes TH as shown in FIG. 5 can be prevented or reduced. Consequently, according to this embodiment, the communication device 1 as the semiconductor device 10 or semiconductor device package which transmits plural differential signals is less likely to deteriorate in reliability than the semiconductor device 10A as shown in FIGS. 10 to 12.

According to this embodiment, the lands LDb1 for differential pairs are located in the outermost periphery (outermost rows) or one row more inward than the outermost periphery. Therefore, in the semiconductor device 10 in this embodiment, the number of differential pairs can be increased more easily than in the semiconductor device 10B shown in FIGS. 13 to 15. Conversely, even if the number of differential pairs is increased, it is possible to prevent an increase in the required plane size of the wiring substrate 12 and thus keep the mounting area relatively small.

In this embodiment, the area of the mounting surface over which the semiconductor device 10 is mounted (namely the plane area of the back surface 12b of the wiring substrate 12) is larger than the area of the main surface 11a of the chip 11. For this reason, the wiring substrate 12 is used as an interposer which adjusts the horizontal positions of the pads PD of the chip 11 and the lands LDb of the mounting board 4 as shown in FIG. 5. Here, an alternative wiring arrangement for the wiring substrate 12 may be as follows: the transmission paths which constitute a differential pair and are connected to the pads PD1 are not led outside the leads BL1 by wires 17, and lands LDp1 and LDb1 are located just under the leads BL. In this case, the length of the transmission paths which constitute a differential pair can be shorter than in the case shown in FIG. 5. However, in this arrangement, it is impossible to put the lands LDp1 and LDb1 in the outermost periphery of the matrix pattern because the lands LDp1 and LDb1 are located just under the leads BL1. As a result, it is difficult to increase the number of differential pairs. Also, in the mounting board 4, it is difficult to use the wires 6a in the uppermost layer for the transmission paths to be connected to the lands LDb1. Therefore, in this embodiment, the wiring substrate 12 produced by the build-up technique is used as an interposer and the lands LDp1 and LDb1 are located outward of the leads BL1 in a perspective plane. The vias 16 as the interlayer conducting paths of the wiring substrate 12 are made by depositing metal film such as copper or nickel film by a plating technique and patterning it as mentioned earlier. Therefore, they are less likely to cause a characteristic impedance mismatch than the conductor membranes THM in the through holes TH as the interlayer conducting paths of the mounting board 4. Therefore, in a perspective plane, the lands LDp1 and LDb1 can be located outward of the leads BL1 and led outward (namely toward the side surface 12c of the wiring substrate 12) through the vias 16 and wires 17. Thus the number of differential pairs can be increased. Also, in the mounting board 4, the wires 6a in the uppermost layer can be used for the transmission paths to be connected to the lands LDb1. On the other hand, the mounting board 4 is a base board which carries and holds many electronic components 5 as shown in FIG. 1 and is larger than the wiring substrate 12 shown in FIG. 5. For the purpose of manufacturing cost reduction, it is desirable to use the conductor membranes (in-hole conductor) THM formed in the through holes TH penetrating the plural wiring layers as interlayer conducting paths. According to this embodiment, since all the transmission paths that constitute differential pairs can be connected to an external device using the wires 6a in the uppermost layer, even if the mounting board 4 like this is employed, deterioration in reliability can be prevented. In addition, since the transmission paths which constitute differential pairs are formed in the same layer, the wiring pattern of the transmission paths can be simplified and matching of the characteristic impedances is thus easy.

Figure 7:
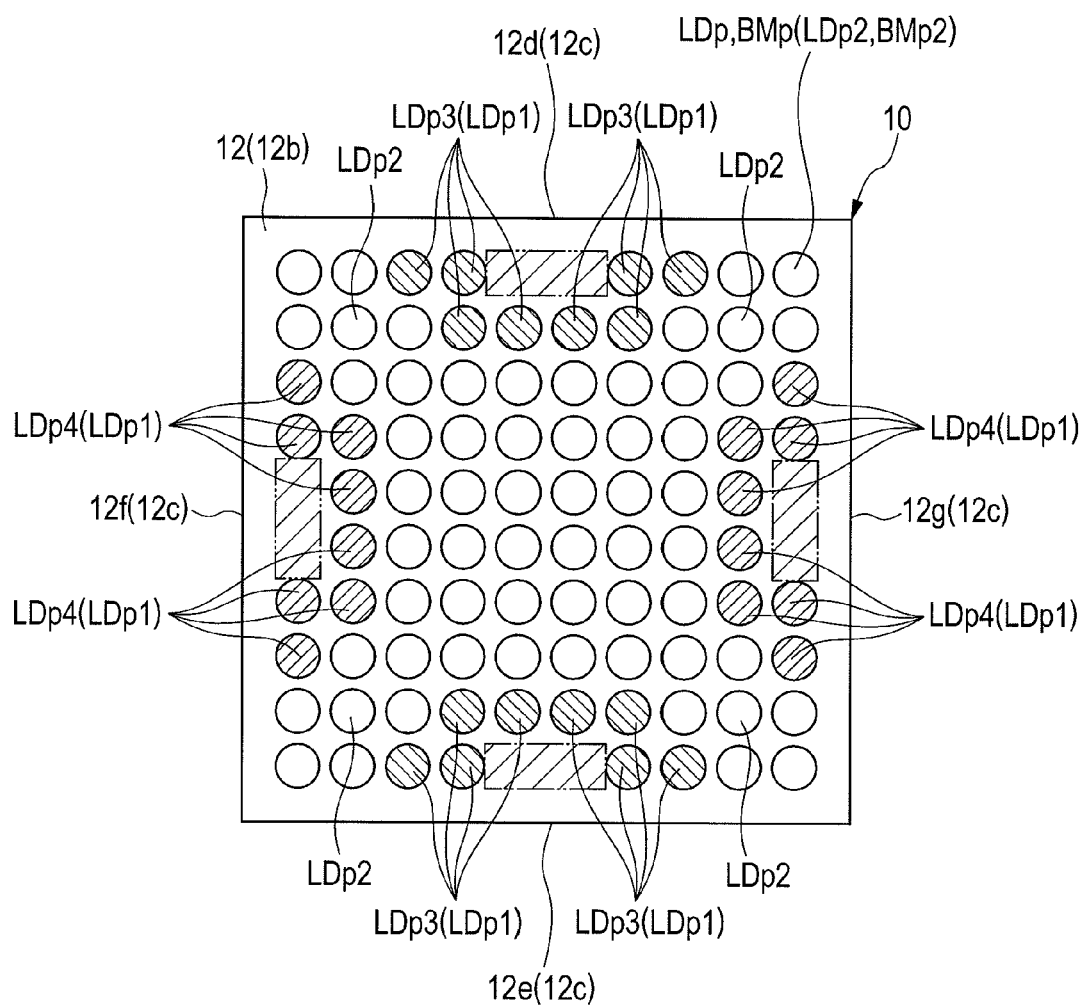
FIG. 7 is a plan view showing further details of the arrangement of the external terminals of the wiring substrate shown in FIG. 6.

Next a preferable mode for transmitting plural differential signals with different signal intensities using the above semiconductor device 10 and communication device 1 will be described. FIG. 7 is a plan view showing the arrangement of the external terminals of the wiring substrate shown in FIG. 6 in further detail.

As mentioned earlier, the semiconductor device 10 in this embodiment is an amplifier which amplifies an incoming signal and outputs the amplified signal. The lands LDp1 for differential pairs include receiving lands LDp1 for transmitting an incoming signal to the semiconductor device 10 and sending lands LDp1 for transmitting an outgoing signal from the semiconductor device 10. In the amplifier, the signal intensity of incoming signals is different from that of outgoing signals and outgoing signals have a higher signal intensity (a larger current flows). When differential signals with different signal intensities are transmitted, for the sake of reducing the influence between differential signals it is desirable that the lands LDp1 for transmitting higher intensity differential signals (for sending signals) should be kept away from the lands LDp1 for transmitting lower intensity differential signals (for receiving signals).

Therefore, this embodiment adopts the arrangement as shown in FIG. 7. In the back surface 12b of the four-sided wiring substrate 12, plural sending lands LDp1 and plural receiving lands LDp1 are arranged along the sides of the back surface 12b of the wiring substrate 12 in groups. Specifically, regarding the sending lands LDp3, a group of four differential pairs (lands LDp3) are located along each of the first side 12d and the second side 12e facing the first side 12d, among the four sides of the wiring substrate 12. On the other hand, regarding the receiving lands LDp4, a group of four differential pairs (lands LDp4) are located along each of the third side 12f and fourth side 12g intersecting the first side 12d and second side 12e, among the four sides of the wiring substrate 12. In addition, lands LDp2 in which a different current from the current of differential signals flows are provided between the sending lands LDp3 and the receiving lands LDp4. In other words, the lands LDp3 are located along the first side 12d and second side 12e and the lands LDp4 are not located there. The lands LDp4 are located along the third side 12f and fourth side 12g and the lands LDp3 are not located there. Namely, in this embodiment, the lands LDp2 which do not constitute differential pairs are located in the outermost periphery and one row more inward of the outermost periphery. The type of current which flows in the lands LDp2 located between the sending lands LDp3 and the receiving lands LDp4 is not limited but for the purpose of reducing the influence on the receiving lands LDp4, the lands LDp2 are intended to supply, for example, reference voltage/current.

They reduce the influence between differential signals. In other words, they help prevent, deterioration in the reliability of the communication device 1 as the semiconductor device 10 or semiconductor device package for transmitting plural differential signals.

The invention made by the present inventors has been so far explained in reference to the preferred embodiment thereof. However, the invention is not limited to the above embodiment and it is obvious that these details may be modified in various ways without departing from the spirit and scope thereof.

Figure 8:
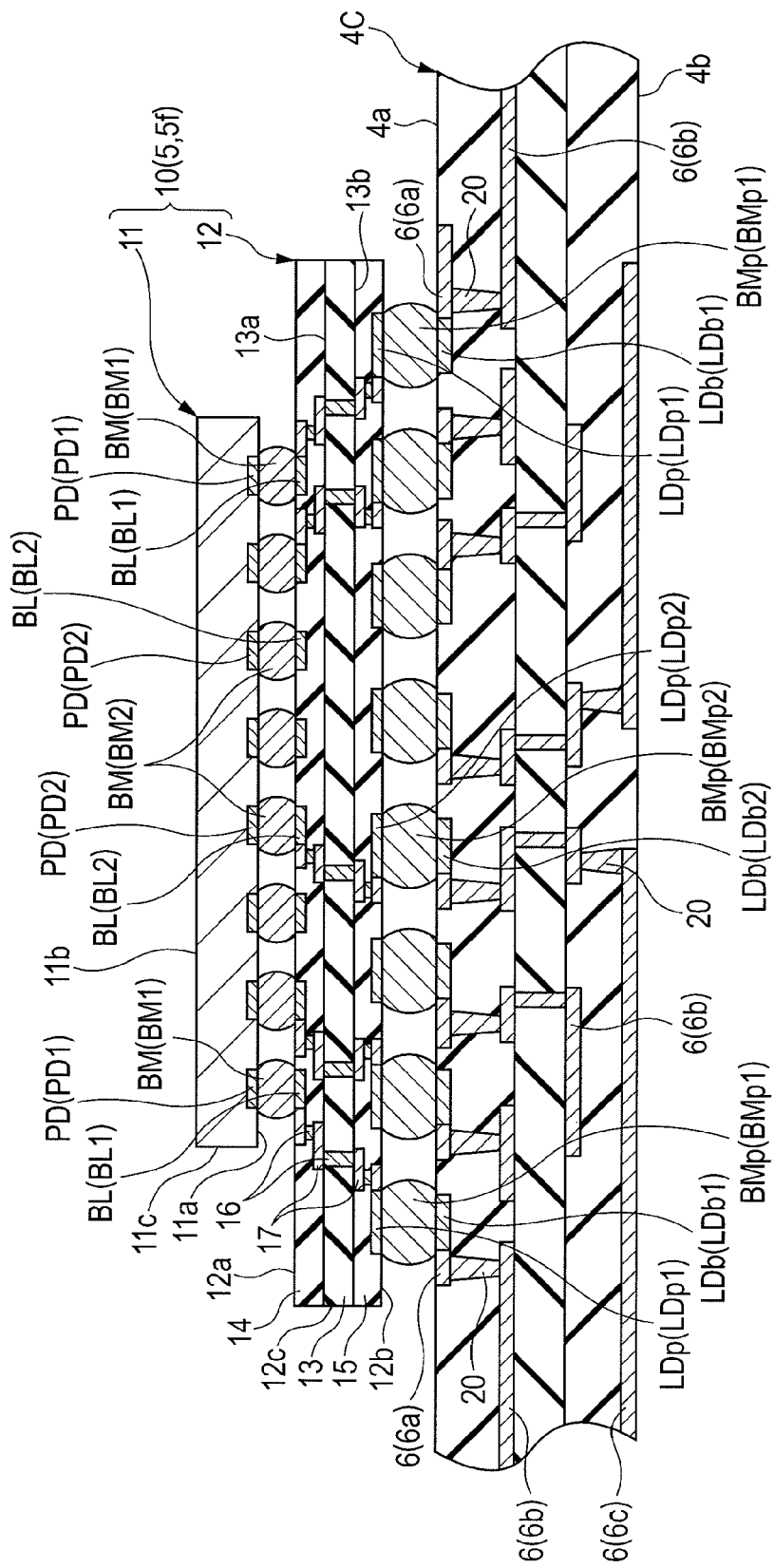
FIG. 8 is an enlarged sectional view showing a variation of the structure shown in FIG. 5.

For example, in the above embodiment, the transmission paths constituting plural differential pairs are led out through the wires 6a formed in the uppermost wiring layer; however, they may be led out through the wires 6b formed in the second wiring layer as shown in FIG. 8. FIG. 8 is an enlarged sectional view showing a variation of the structure shown in FIG. 5.

The structure shown in FIG. 8 is different from the structure shown in FIG. 5 in that the plural transmission paths constituting plural differential pairs are led out through the wires 6b formed in the second wiring layer. Even when the transmission paths are led out through an underlying wiring layer in this way, it is easy to equalize the length of the transmission paths since the transmission paths are formed in the same layer. However, when the transmission paths are led out through an underlying wiring layer, the transmission paths for differential pairs include the interlayer conducting paths in the mounting board 4C. Therefore, it is desirable to produce the mounting board 4C, for example, by the build-up technique and use the vias 20 made in each wiring layer (vias which do not penetrate all the wiring layers) as interlayer conducting paths like the wiring substrate 12, as shown in FIG. 8. This prevents characteristic impedance mismatching in the transmission paths for differential pairs. However, in order to prevent characteristic impedance mismatching more surely, it is desirable to lead them out through the wires 6a in the uppermost wiring layer as mentioned in connection with the above embodiment. In this case, the process for manufacturing the mounting board 4 can be simplified, leading to manufacturing cost reduction.

Figure 9:
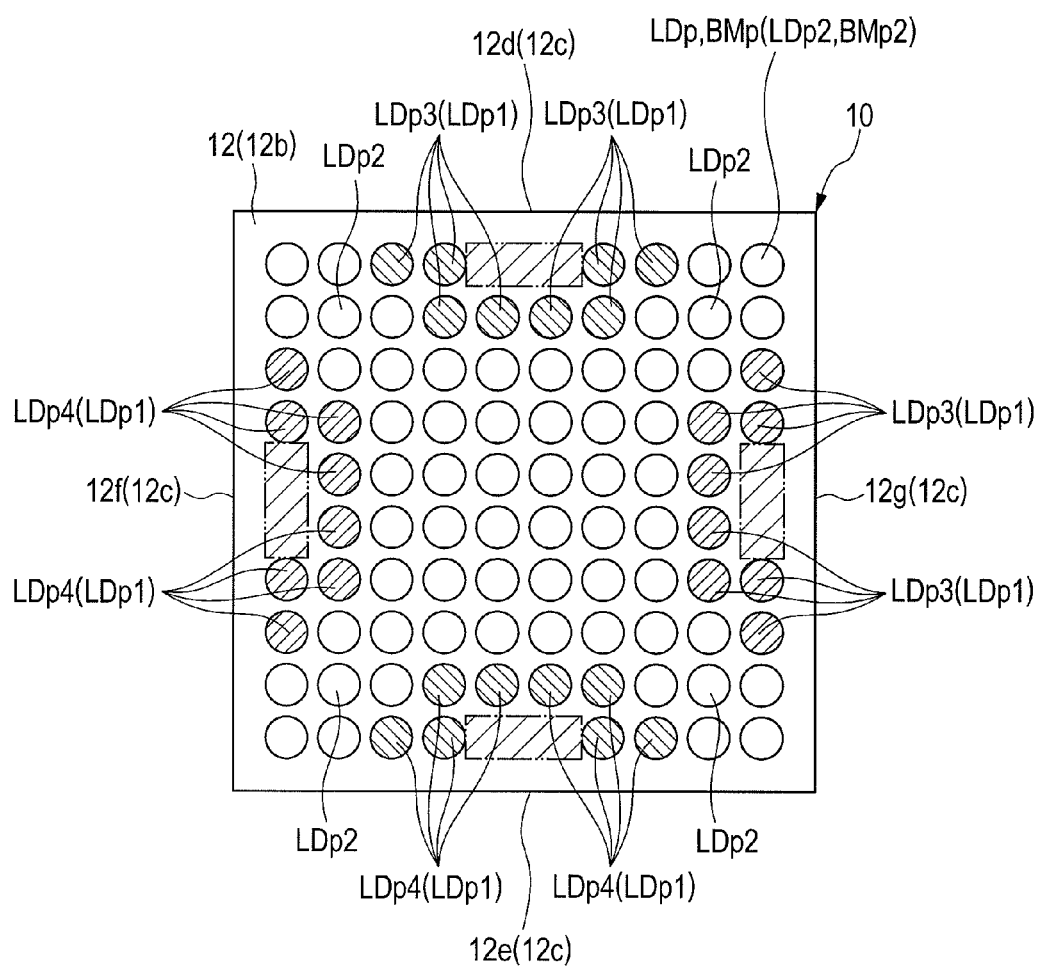
FIG. 9 is a plan view showing a variation of the arrangement shown in FIG. 7.

Furthermore, while in the above embodiment the sending lands LDp3 are located in groups along the first side 12d and the second side 12e facing the first side 12d, among the four sides of the wiring substrate 12, and the receiving lands LDp4 are located in groups along the third side 12f and fourth side 12g intersecting the first side 12d and second side 12e, variation of this arrangement is shown in FIG. 9. FIG. 9 is a plan view showing the variation of the arrangement shown in FIG. 7.

As shown in FIG. 9, regarding the sending lands LDp3, a group of four differential pairs (lands LDp3) are located along each of the first side 12d and the fourth side 12g intersecting the first side 12d, among the four sides of the wiring substrate 12. On the other hand, regarding the receiving lands LDp4, a group of four differential pairs (lands LDp4) are located along each of the second side 12e facing the first side 12d and the third side 12f intersecting the first side 12d and second side 12e, among the four sides of the wiring substrate 12. In other words, the lands LDp3 are located along the first side 12d and fourth side 12g and the lands LDp4 are not located there. The lands LDp4 are located along the second side 12e and third side 12f and the lands LDp3 are not located there. Namely, in the variation shown in FIG. 9, the back surface 12b of the wiring substrate 12 is divided by a diagonal into two areas; in one area the lands LDp3 are located and the lands LDp4 are not located and in the other area the lands LDp4 are located and the lands LDp3 are not located.

In the variation shown in FIG. 9, the number of areas where the sending lands LDp3 and receiving lands LDp4 are close to each other can be smaller than in the arrangement shown in FIG. 7. Concretely, in the arrangement shown in FIG. 7, the sending lands LDp3 and receiving lands LDp4 are close to each other in the four corner areas of the back surface 12b of the wiring substrate 12. On the other hand, in the variation shown in FIG. 9, the sending lands LDp3 and receiving lands LDp4 are close to each other only in the corner area where the first side 12d and third side 12f cross and the corner area where the second side 12e and fourth side 12g cross. Therefore, the influence between differential signals with different signal intensities is smaller in the variation shown in FIG. 9 than in the arrangement shown in FIG. 7.

The above variation may be combined with the variation shown in FIG. 8.

The present invention can be applied to semiconductor devices such as communication devices which transmit differential signals.

What is claimed is:

1. A semiconductor device comprising:
    a semiconductor chip having a plurality of electrodes including a plurality of first electrode pairs for a plurality of differential pairs for transmitting a differential signal; and
    a wiring substrate having a front surface over which the semiconductor chip is mounted, a back surface opposite to the front surface, a side surface intersecting the front surface and the back surface, and a plurality of external terminals electrically connected to the semiconductor chip and arrayed in a matrix pattern in the back surface,
    wherein the external terminals include:
    a plurality of first external terminal pairs electrically connected to the first electrode pairs of the semiconductor chip; and
    a plurality of second external terminals electrically connected to a plurality of second electrodes different from the first electrode pairs of the semiconductor chip;
    wherein the first external terminal pairs include:
    a third external terminal pair located in an outermost periphery of the matrix pattern in the back surface of the wiring substrate; and
    a fourth external terminal pair located inward of the outermost periphery of the matrix pattern and in a row next to the outermost periphery in the back surface of the wiring substrate,
    wherein the outermost periphery of the matrix pattern includes:
    a first region in which the external terminals are arranged at a first spacing; and
    a second region in which the external terminals are arranged at a second spacing larger than the first spacing,
    wherein the second region lies between the fourth external terminal pair and the side surface of the wiring substrate.

2. The semiconductor device according to claim 1, wherein the second spacing of the second region is larger than a width of one external terminal of the external terminals located in the outermost periphery.

3. The semiconductor device according to claim 2,
    wherein the wiring substrate includes:
    a plurality of bonding leads electrically connected to the electrodes of the semiconductor chip in the front surface; and
    a plurality of wires for connecting the bonding leads and the external terminals electrically, wherein the fourth external terminal pair is led outward of the bonding leads through the wires of the wiring substrate in a plan view.

4. The semiconductor device according to claim 3, wherein the wires of the wiring substrate include a plurality of wires and a plurality of interlayer conducting paths which are formed by a build-up technique.

5. The semiconductor device according to claim 1,
wherein the back surface of the wiring substrate is quadrangular and a plurality of the third external terminal pairs and a plurality of the fourth external terminal pairs are arranged along sides of the back surface; and
wherein the second spacing of the second region is larger than an equivalent to two external terminals of the external terminals located in the outermost periphery.

6. The semiconductor device according to claim 1,
wherein the third external terminal pair and the fourth external terminal pair include a fifth external terminal pair for transmitting a differential signal with a first signal intensity and a sixth external terminal pair for transmitting a differential signal with a second signal intensity higher than the first signal intensity,
wherein the second external terminals are located between the fifth external terminal pair and the sixth external terminal pair.

7. The semiconductor device according to claim 6,
wherein the back surface of the wiring substrate is a quadrangle which has a first side, a second side facing the first side, a third side intersecting the first side and the second side and a fourth side facing the third side;
wherein along the first side and the second side, a plurality of the sixth external terminal pairs are located and the fifth external terminal pair is not located; and
wherein along the third side and the fourth side, a plurality of the fifth external terminal pairs are located and the sixth external terminal pair is not located.

8. The semiconductor device according to claim 6,
wherein the back surface of the wiring substrate is a quadrangle which has a first side, a second side facing the first side, a third side intersecting the first side and the second side, and a fourth side facing the third side;
wherein along the first side and the fourth side, a plurality of the sixth external terminal pairs are located and the fifth external terminal pair is not located; and
wherein along the second side and the third side, a plurality of the fifth external terminal pairs are located and the sixth external terminal pair is not located.

9. A semiconductor device package comprising:
a semiconductor device;
an electronic component electrically connected with the semiconductor device through a mounting board wire formed in a mounting board; and
the mounting board over which the semiconductor device and the electronic component are mounted,
wherein the semiconductor device includes:
a semiconductor chip having a plurality of electrodes including a plurality of first electrode pairs for a plurality of differential pairs for transmitting a differential signal; and
a wiring substrate having a front surface over which the semiconductor chip is mounted, a back surface opposite to the front surface, a side surface intersecting the front surface and the back surface, and a plurality of external terminals electrically connected to the semiconductor chip and arrayed in a matrix pattern in the back surface, wherein the plurality of external terminals include:

a plurality of first external terminal pairs electrically connected to the first electrode pairs of the semiconductor chip; and
a plurality of second external terminals electrically connected to a plurality of second electrodes different from the first electrode pairs of the semiconductor chip;
wherein the plurality of first external terminal pairs include:
a third external terminal pair located in an outermost periphery of the matrix pattern in the back surface of the wiring substrate; and
a fourth external terminal pair located inward of the outermost periphery of the matrix pattern and in a row next to the outermost periphery in the back surface of the wiring substrate,
wherein the outermost periphery of the matrix pattern includes:
a first region in which some of the plurality of external terminals are arranged at a first spacing; and
a second region in which some of the plurality of external terminals are arranged at a second spacing larger than the first spacing, and
wherein the second region lies between the fourth external terminal pair and the side surface of the wiring substrate.

10. The semiconductor device package according to claim 9,
wherein the mounting board includes:
a mounting surface over which the semiconductor device is mounted;
a plurality of wiring layers in each of which a plurality of the mounting board wires are formed; and
a plurality of mounting terminals formed in an uppermost wiring layer among the plurality of wiring layers and electrically connected to the plurality of external terminals of the semiconductor device,
wherein the plurality of mounting terminals include:
a plurality of first mounting terminal pairs electrically connected to the plurality of first external terminal pairs of the semiconductor device; and
a plurality of second mounting terminals electrically connected to the plurality of second external terminals of the semiconductor device,
wherein the plurality of first mounting terminal pairs include:
a third mounting terminal pair located in the outermost periphery of the matrix pattern in the back surface of the wiring substrate; and
a fourth mounting terminal pair located inward of the outermost periphery of the matrix pattern and in a row next to the outermost periphery in the back surface of the wiring substrate, and
wherein the plurality of first mounting terminal pairs are each electrically connected to the electronic component through the mounting board wires formed in a wiring layer among the plurality of wiring layers.

11. The semiconductor device package according to claim 10, wherein the plurality of first mounting terminal pairs are each electrically connected to the electronic component through the mounting board wires formed in the uppermost wiring layer, among the plurality of wiring layers, in which the plurality of mounting terminals are formed.

12. The semiconductor device package according to claim 11,
wherein the plurality of wiring layers of the mounting board are electrically connected through a through hole penetrating the wiring layers and an interlayer conducting path formed in the through hole and made of conductor; and wherein the plurality of first mounting terminal pairs are not connected to the interlayer conducting path.

13. The semiconductor device package according to claim 12, wherein the second spacing of the second region is larger than a width of one external terminal of the plurality of external terminals located in the outermost periphery, and wherein one or more pairs of the mounting board wires electrically connected to the fourth mounting terminal pair are located in a region facing the second region in the uppermost wiring layer of the mounting board.

14. The semiconductor device package according to claim 13, wherein the back surface of the wiring substrate is quadrangular and a plurality of the third external terminal pairs and a plurality of the fourth external terminal pairs are arranged along sides of the back surface;

wherein the second spacing of the second region is larger than an equivalent to two external terminals of the plurality of external terminals located in the outermost periphery; and wherein a plurality of pairs of the mounting board wires electrically connected to the fourth mounting terminal pair are located in a region facing the second region in the uppermost wiring layer of the mounting board.

15. The semiconductor device package according to claim 9, wherein the third external terminal pair and the fourth external terminal pair include a fifth external terminal pair for transmitting a differential signal with a first signal intensity and a sixth external terminal pair for transmitting a differential signal with a second signal intensity higher than the first signal intensity; and wherein the plurality of second external terminals are located between the fifth external terminal pair and the sixth external terminal pair.

16. The semiconductor device package according to claim 15, wherein the back surface of the wiring substrate is a quadrangle which has a first side, a second side facing the first side, a third side intersecting the first side and the second side, and a fourth side facing the third side;

wherein along the first side and the second side, a plurality of the sixth external terminal pairs are located and the fifth external terminal pair is not located; and wherein along the third side and the fourth side, a plurality of the fifth external terminal pairs are located and the sixth external terminal pair is not located.

17. The semiconductor device package according to claim 15, wherein the back surface of the wiring substrate is a quadrangle which has a first side, a second side facing the first side, a third side intersecting the first side and the second side, and a fourth side facing the third side;

wherein along the first side and the fourth side, a plurality of the sixth external terminal pairs are located and the fifth external terminal pair is not located; and wherein along the second side and the third side, a plurality of the fifth external terminal pairs are located and the sixth external terminal pair is not located.

* * * * *